(12) United States Patent
Chiu et al.

(10) Patent No.: US 8,274,091 B1
(45) Date of Patent: Sep. 25, 2012

(54) LIGHT EMITTING DEVICE WITH LIGHT EXTRACTION LAYER AND FABRICATING METHOD THEREOF

(75) Inventors: Tien Lung Chiu, Zhongli (TW); Jiun Haw Lee, Zhongli (TW)

(73) Assignee: Yuan Ze University, Zhongli, Taoyuan County (TW)

( * ) Notice: Subject to any disclaimer, the term of this patent is extended or adjusted under 35 U.S.C. 154(b) by 0 days.

(21) Appl. No.: 13/177,554

(22) Filed: Jul. 7, 2011

(51) Int. Cl.
*H01L 33/00* (2010.01)
(52) U.S. Cl. .......................................... 257/88; 438/116
(58) Field of Classification Search .................. 438/237, 438/328; 257/88, E51.018, E51.021
See application file for complete search history.

(56) References Cited

U.S. PATENT DOCUMENTS

| | | | | |
|---|---|---|---|---|
| 5,917,202 | A * | 6/1999 | Haitz et al. | 257/98 |
| 6,992,331 | B2 * | 1/2006 | Hon et al. | 257/79 |
| 7,723,737 | B2 * | 5/2010 | Lee et al. | 257/88 |
| 2004/0211969 | A1 * | 10/2004 | Ishizaki | 257/94 |
| 2006/0001056 | A1 * | 1/2006 | Saxler | 257/257 |

* cited by examiner

*Primary Examiner* — Thao P. Le
(74) *Attorney, Agent, or Firm* — Chih Feng Yeh; Huntington IP Consulting Co., Ltd.

(57) ABSTRACT

A light emitting device with a light extraction layer and the fabricating method thereof are provided. Embedding a light extraction layer between an emitting layer and a packaging layer can reduce the difference in the refractive index between the emitting layer and the packaging layer. In addition, the refractive index of the light extraction layer is adjustable by doping various concentrations of metal materials in the light extraction layer. The mechanism helps improving the light emitting efficiency of the light emitting device.

10 Claims, 6 Drawing Sheets

LIGHT EMITTING DEVICE WITH LIGHT EXTRACTION LAYER AND FABRICATING METHOD THEREOF

BACKGROUND OF THE INVENTION

1. Technical Field

The invention relates to a light emitting device and the fabricating method thereof. In particular, the invention relates to a light emitting device with a light extraction layer, that can reduce the difference in the refractive index between the emitting layer and the packaging layer by embedding a light extraction layer that matches the refractive index. The invention also relates to the fabricating method thereof.

2. Related Art

With prosperous development and energy-saving concept in semiconductor technology in recent years, using light emitting diodes (LED's) to replace traditional illumination and display devices has been widely accepted. It even has become one of the most noticeable industries.

Generally speaking, traditional LED does not have a matching refractive index between the light emitting material (i.e., emitting layer) and air or packaging glue (i.e., packaging layer). Therefore, most photons are totally reflected. Photons can penetrate through the packaging layer only when the incident angle is less than the critical angle, thus visible to eyes. The photons that cannot go through are absorbed by the LED, resulting in bad light emitting efficiency. Take the most popular blue LED material, GaN, as an example. Its refractive index $n_{GaN}$ is roughly between 2.5 and 2.8. Another blue LED material InGaN has a refractive index $n_{InGaN}$ around 3.3. The red LED material GaAs has a refractive index $n_{GaAs}$ around 4. The refractive indices of the above-mentioned materials have a large difference from that of the air or packaging layer. It is helpful to extract photons inside the LED if we could reduce the difference between the refractive indices of the emitting layer and the external medium (e.g., air or packaging layer).

In view of this, some vendors propose to use packaging glue with a high refractive index as the packaging layer of the LED. The packaging glue may even be doped with materials with a scattering mechanism, such as fluorescent powders, TiO2 powders, etc. Besides, some vendors also change the packaging structure of the LED to reduce total reflection, thereby increasing light output efficiency. However, using packaging glue with a high refractive index as the packaging layer costs a lot and is not easy to obtain. Changing the packaging structure of the LED increases packaging difficulty and reduces the yield. Therefore, the above two methods cannot effectively solve the problem with bad light emitting efficiency.

In summary, the prior art always has the problem of being unable to effectively increase light emitting efficiency of LED. It is imperative to provide a better solution.

SUMMARY

In view of the foregoing, this specification discloses a light emitting device with a light extraction layer and the fabricating method thereof.

The disclosed light emitting device with a light extraction layer includes: an emitting layer, a light extraction layer, and a packaging layer. The emitting layer combines electrons and holes to produce multiple photons. The light extraction layer is formed on the emitting layer and doped with a metal material for adjusting the refractive index of the light extraction layer, thereby increasing the penetrating rate of photons. The packaging layer is formed on the light extraction layer for protecting the light emitting device and for the photons to go through.

The disclosed fabricating method includes the steps of: providing an emission later for combining electrons and holes and generating a plurality of photons; forming a light extraction layer on the emission layer and doping the light extraction layer with a metal material for adjusting the refractive index thereof in order to increase the penetration rate of the photons; forming a packaging layer on the light extraction layer for protecting the light emitting device and for the photons to go through the packaging layer.

The invention differs from the prior art in that the invention embeds a light extraction layer between the emission layer and the packaging layer, thereby reducing the refractive index difference in between. The light extraction layer is further doped with a metal material in order to adjust the refractive thereof.

Through the above-mentioned techniques, the invention achieves the goal of enhancing light efficiency of the light emitting device.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
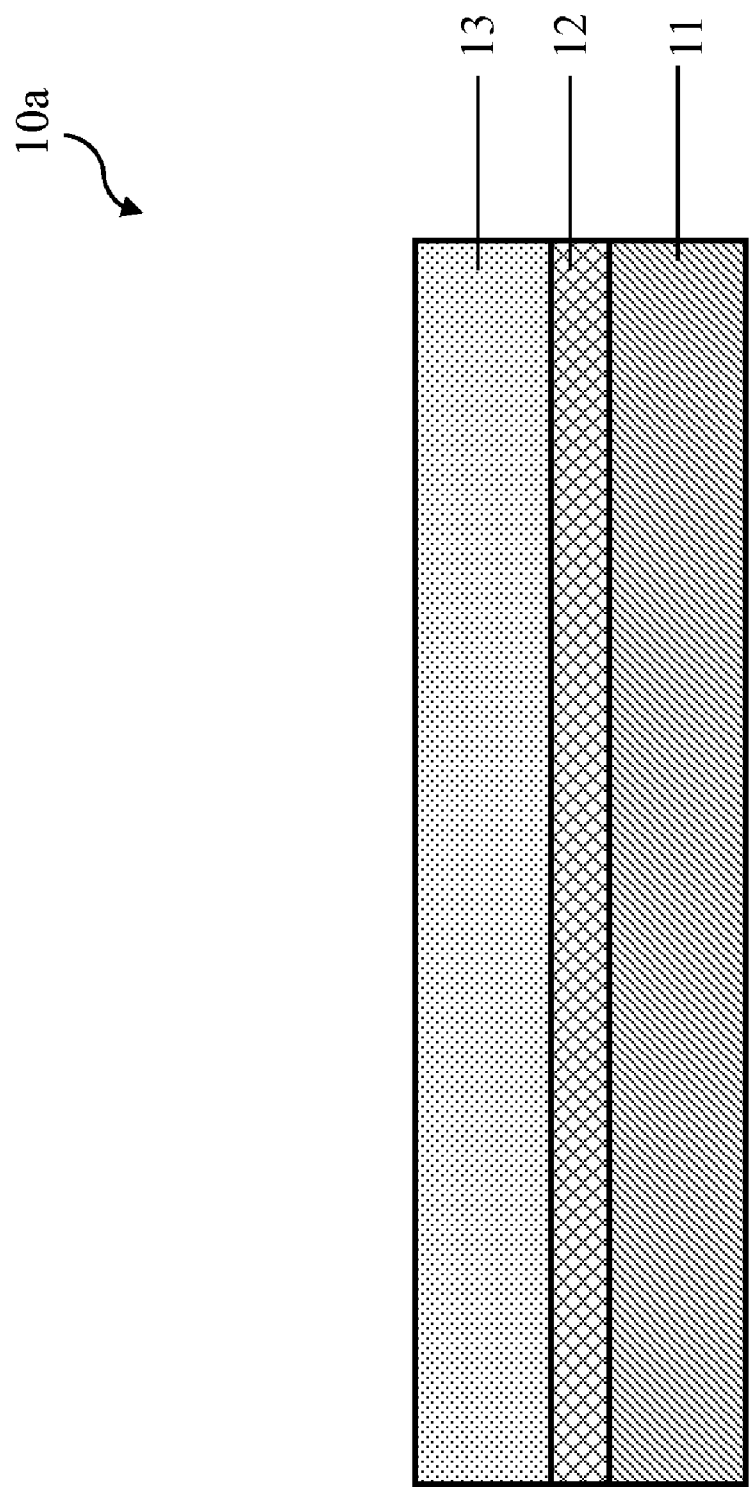
FIG. 1 is a cross-sectional view of the first embodiment of the disclosed light emitting device with a light extraction layer.

First, please refer to FIG. 1 for a cross-sectional view of the disclosed light emitting device with a light extraction layer. The light emitting device 10a includes: an emission layer 11, a light extraction layer 12, and a packaging layer 13. The emission layer 11 combines electrons and holes to produce multiple photons. The emission layer 11 can be material layer such as light emitting diode (LED), organic light emitting diode (OLED), and so on that can generate photons. For example, suppose the emission layer 11 is an LED. Then the emission layer 11 can be an N-type semiconductor layer doped with N-type impurities (also called donors), such as silicon (Si), phosphorus (P), arsenic (As), and antimony (Sb) that belong to group-V elements, or a P-type semiconductor layer doped with P-type impurities (also called acceptor), such as magnesium (Mg), boron (B), aluminum (Al), gallium (Ga), and indium (In) that belong to group-III elements. The emission layer 11 can thus provide electrons or holes and allow the two to convert into photons. In practice, the N-type semiconductor layer and the P-type semiconductor layer can have an active layer with the structure of multi quantum wells (MQW) or quantum dots in between, so that electrons and holes are more likely to be confined together to increase the light emitting strength, i.e., increasing the conversion rate from electricity to optical energy. Since the LED structure and the MQW structure are well known in the prior art, they are not further described herein. It should be noted that the light emitting device 10a does not include a substrate. This is because after the emission layer 11 is successfully formed on the substrate, it can be removed by using laser or polishing. This increases the light emission efficiency and heat dissipation effect of the light emitting device 10a.

If the emission layer 11 is an OLED, then it is a stack of indium tin oxide (ITO), an OLED layer, and a cathode layer (not shown). ITO is a transparent anode material, with such features as high transparent rate, low electric resistance, high chemical stability, and easy to etch. After a voltage is imposed on the ITO and the cathode layer, they provide holes and electrons, respectively. The holes and electrons combine in the OLED between the ITO and the cathode layer, providing energy to generate photons. The OLED layer can use a fluorescent or phosphorous material. The energy levels of the chemicals are adjusted by modifying the molecular structure or functional group. Since the layer structure of the OLED is well known, it is not further described herein.

The light extraction layer 12 is formed on the emission layer 11, and is doped with a metal material, such as Al, Ag, etc, for adjusting the refractive index of the light extraction layer 12, thereby increasing the penetration rate of photons produced by the emission layer 11. The metal material can be doped into the light extraction layer 12 by co-evaporation, rendering a material with a refractive index between 1.5 and 2.5. The thickness of the light extraction layer 12 can be adjusted according to the harmonic oscillations of photons. The light extraction layer 12 may even cover the entire or sides of the emission layer 11. In practice, the light extraction layer 12 can be 4,4'-bis[N-(1-naphthyl)-N-phenyl-amino]biphenyl (NPB), tris(8-hydroxyquinolinato)aluminum (Alq3), or consisting of NPB and Alq3, etc., whose refractive index is between those of the emission layer 11 and the packaging layer 13. It should be noted that the invention is not restricted to use the above-mentioned material for the light extraction layer 12. Any material whose refractive index is between those of the emission layer 11 and the packaging layer 13 belongs to the invention. In the case without the packaging layer 13, the refractive index of the light extraction layer 12 is between those of the emission layer 11 and the packaging layer 13. The refractive index can be appropriately adjusted according to the concentration of the doped metal material.

The packaging layer 13 is formed on the light extraction layer 12 to protect the light emitting device 10a and for the photons produced by the emission layer 11 to pass through. In practice, the material of the packaging layer 13 can be silicone or epoxy resin whose refractive index is around 1.5. Since the packaging layer 13 also belongs to the prior art, it is not further described here.

Figure 2:
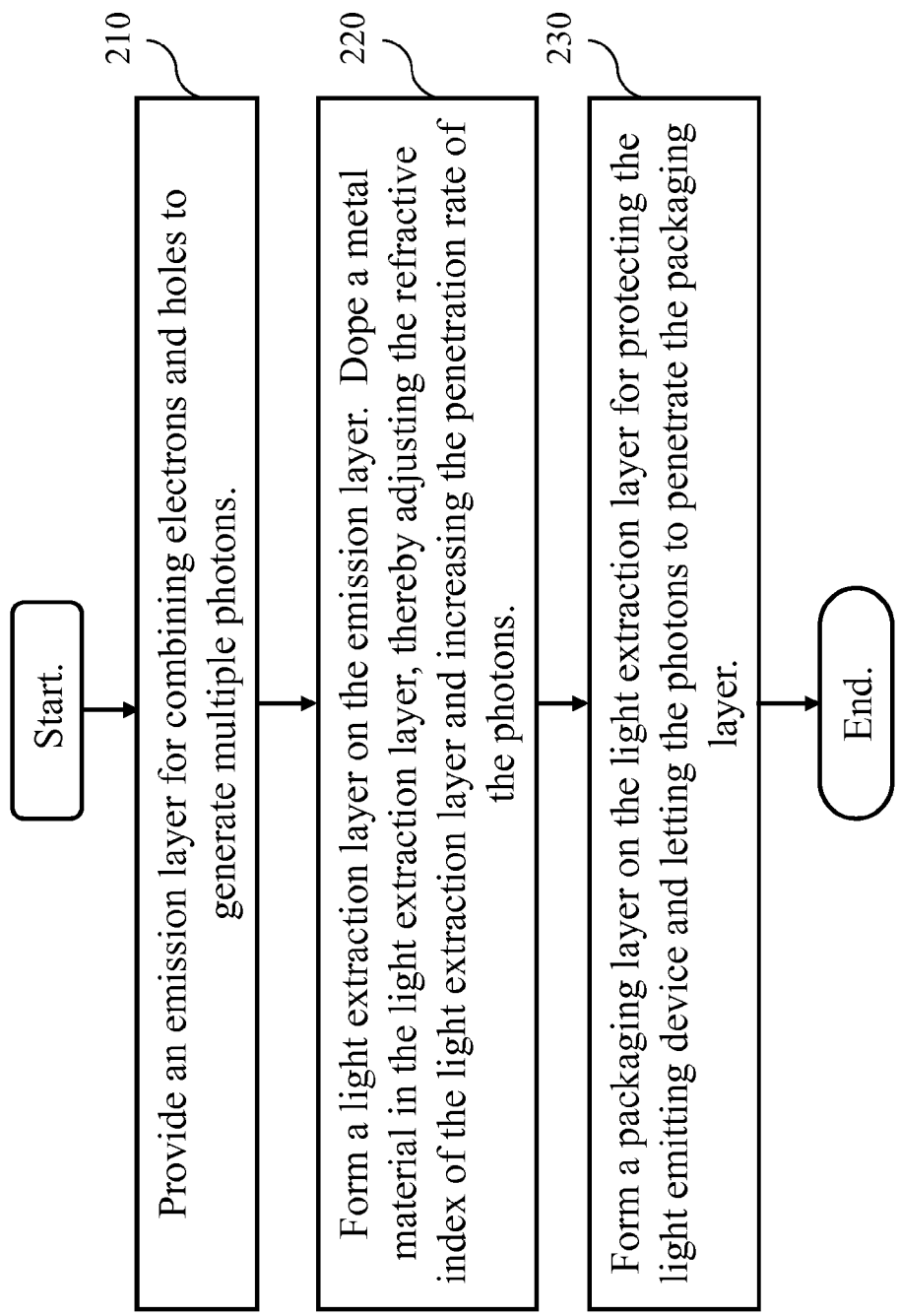
FIG. 2 is a flowchart of the fabricating method of the disclosed light emitting device with a light extraction layer.

FIG. 2 is a flowchart of the disclosed fabricating method for the light emitting device with a light extraction layer. The method includes the following steps. Step 210 provides an emission layer 11 for combining electrons and holes to produce multiple photons. Step 220 forms a light extraction layer 12 on the emission layer 11, and dopes a metal material therein, thereby adjusting the refractive index of the light extraction layer 12 to increase the penetration rate of photons. Step 230 forms the packaging layer 13 on the light extraction layer 12 for protecting the light emitting device 10a and letting the photons pass through the packaging layer 13. Through the above-mentioned steps, the light extraction layer 12 is embedded between the emission layer 11 and the packaging layer 13 to reduce the difference between the refractive indices of the emission layer 11 and the packaging layer 13.

Figure 3A:
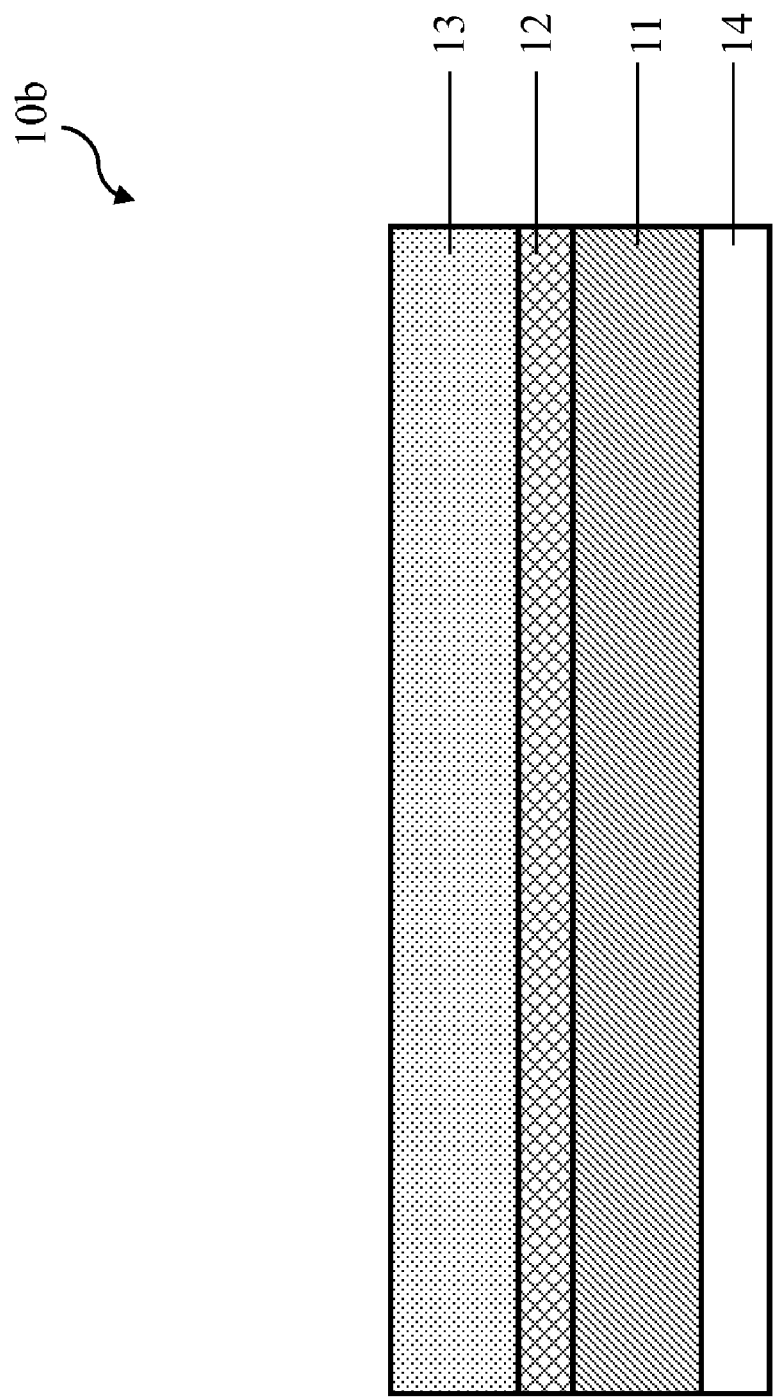
FIG. 3A is a cross-sectional view of the second embodiment of the disclosed light emitting device with a light extraction layer.

Please refer to FIG. 3A for the cross-sectional view of a second embodiment of the disclosed light emitting device with a light extraction layer. As mentioned before, the substrate of the light emitting device 10a is removed by laser in order to increase the light emitting efficiency and heat dissipation effect. In practice, however, the substrate 14 under the emission layer 11 of the light emitting device 10b can be kept, as shown in FIG. 3A. The substrate 14 can be sapphire, silicon, germanium (Ge), SiC, GaAs or glass for evaporation, sputtering, or printing a thin film. The evaporation method can be the metal-organic vapor deposition (MOCVD), thermal evaporator, etc. But the invention is not limited to this particular example. It should be noted that the substrate 14 is not limited to the above-mentioned optoelectric substrates. Any substrate that can be used as an optoelectric element should be covered by the invention.

Figure 3B:
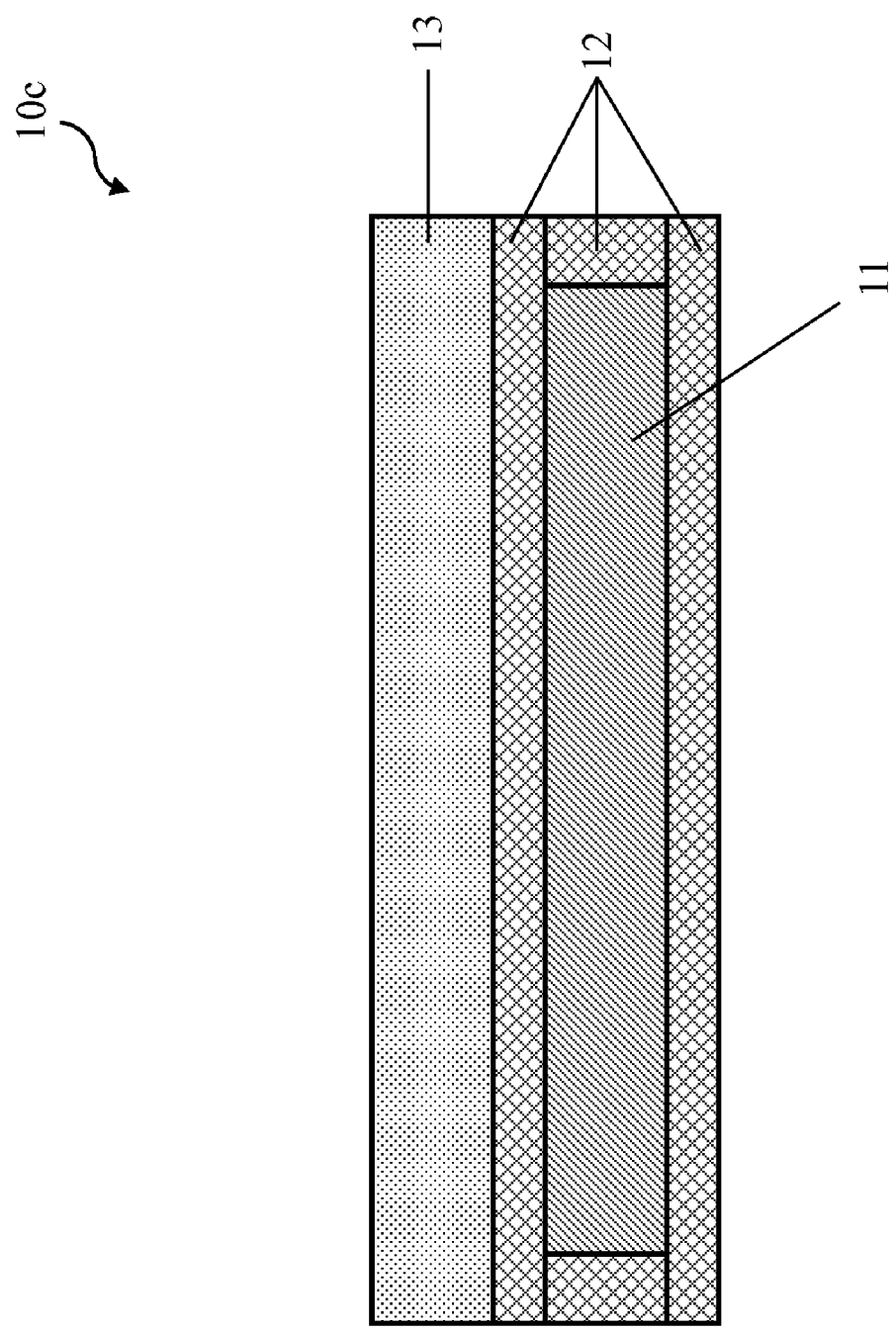
FIG. 3B is a cross-sectional view of the third embodiment of the disclosed light emitting device with a light extraction layer.

Please refer to FIG. 3B for the cross-sectional view of a third embodiment of the disclosed light emitting device with a light extraction layer. As mentioned before, in addition to being formed on the emission layer 11, the light extraction layer 12 further covers the entire or side of the emission layer 11. Take the example of covering the emission layer 11. The covering method is as shown in the light emitting device 10c in FIG. 3B. The light extraction layer 12 is formed on the surface of the emission layer 11 to cover the entire emission layer 11. Afterwards, the packaging layer 13 is formed on the light extraction layer 12 to protect the light emitting device 10c. The difference between using the light extraction layer 12 to cover the side of the emission layer 11 and to cover the entire emission layer 11 is in that the bottom of the emission layer 11 is not covered by the light extraction layer 12. It is not further described here.

Figure 3C:
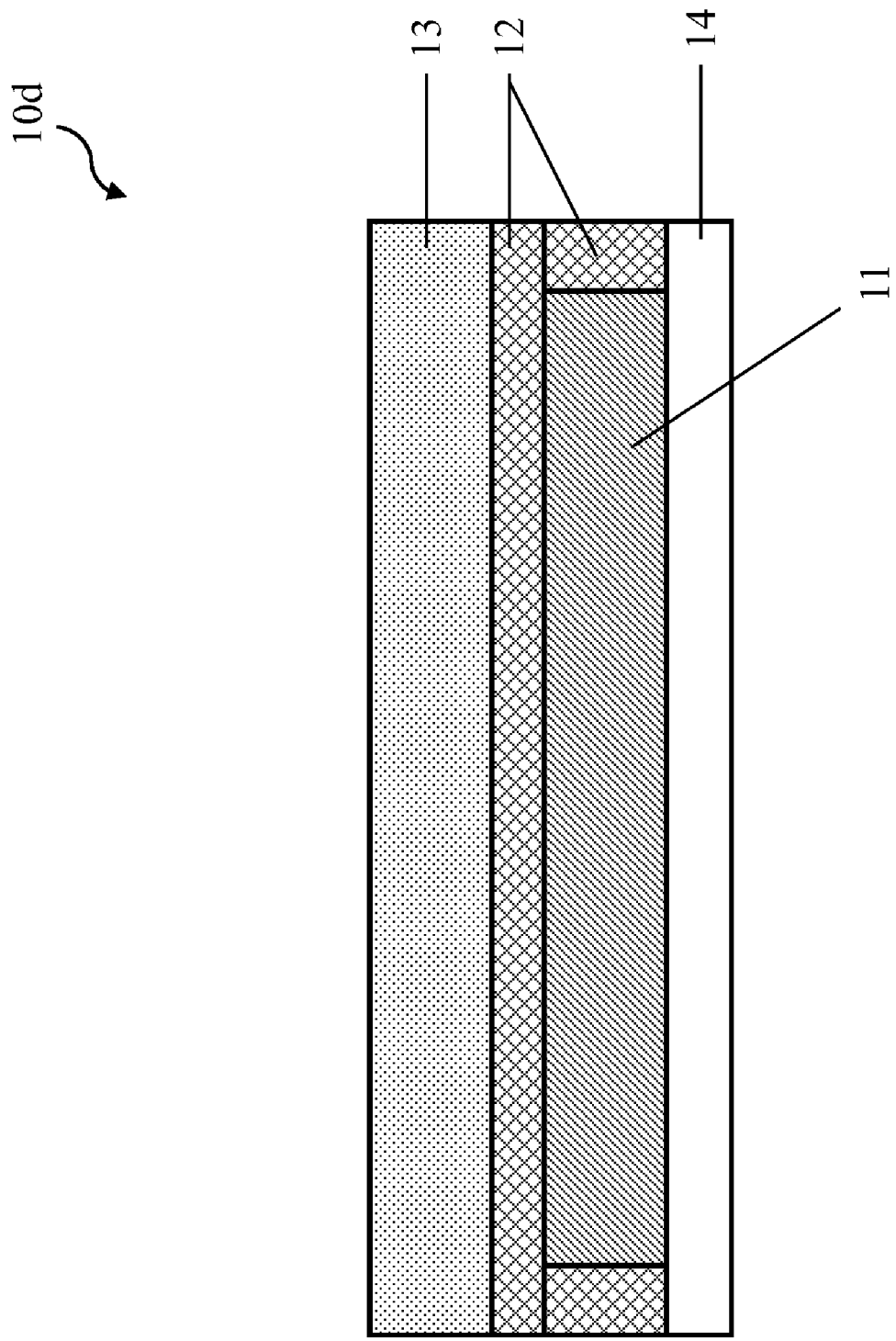
FIG. 3C is a cross-sectional view of the fourth embodiment of the disclosed light emitting device with a light extraction layer.

Please refer to FIG. 3C for the cross-sectional view of a fourth embodiment of the disclosed light emitting device with a light extraction layer. Suppose the substrate 14 of the light emitting device 10d is not removed by laser, the light extraction layer 12 can cover the side of the light emitting layer 11, as shown in FIG. 3C. In this case, some part of the light extraction layer 12 is in touch with the substrate 14. Afterwards, the packaging layer 13 is formed on the light extraction layer 12 to protect the light emitting device 10d.

Figure 4:
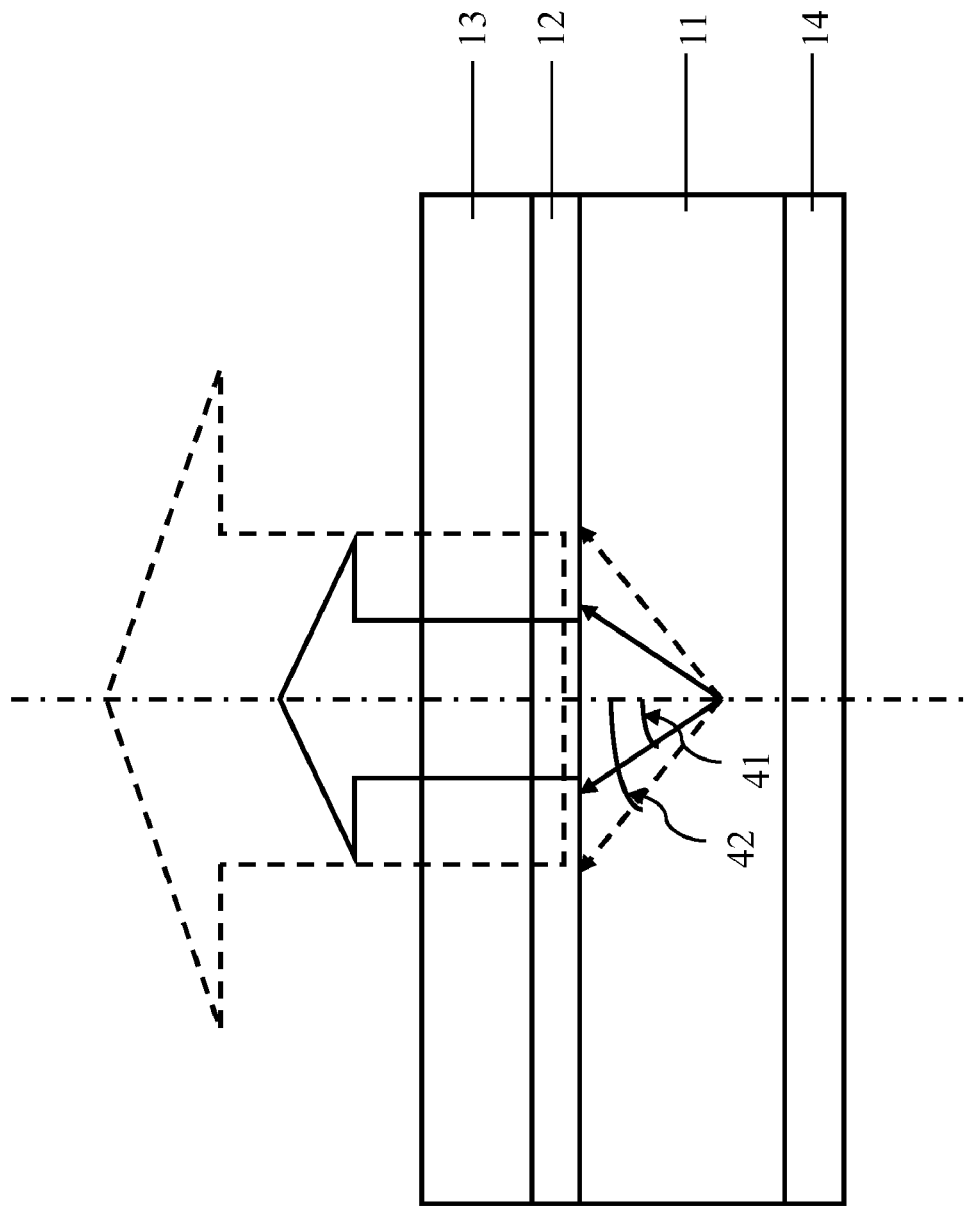
FIG. 4 is a schematic view showing better light emitting efficiency of the light emitting device.

Finally, FIG. 4 is a schematic view showing better light emitting efficiency of the disclosed light emitting device. When there is no light extraction layer 12, the photons can penetrate through the boundary between the emission layer 11 and the packaging layer 13 when the incident angle is smaller than a first critical angle 41. The propagation of photons is indicated by the solid arrow. Photons whose incident angle is greater than the first critical angle are reflected and restricted within the emission layer 11 until they are totally absorbed. However, when the light extraction layer 12 exists between the light emitting layer 11 and the packaging layer 13, the photons generated from the emission layer 11 penetrate the boundary between the emission layer 11 and the packaging layer 13 when the incident angle is smaller than a second critical angle 42. The propagation of such photons is indicated by the dashed arrow. Photons whose incident angle is greater than the second critical angle 42 are still reflected and restricted within the emission layer 11 until they are totally absorbed. However, since the second critical angle 42 is greater than the first critical angle 41, there are more penetrating photons than the case without the light extraction layer 12. The light emitting efficiency of the light emitting device is thus better.

In summary, the invention differs from the prior art in that the light extraction layer 12 is embedded between the emission layer 11 and the packaging layer 13 to reduce the difference in the refractive indices of the emission layer 11 and the packaging layer 13. The light extraction layer 12 is doped with a metal material to adjust the refractive index thereof. The disclosed technique can solve problems in the prior art, thereby increasing the light emitting efficiency of the light emitting devices 10a to 10d.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A light emitting device with a light extraction layer, comprising:
   an emission layer for combining electrons and holes and generating a plurality of photons;
   a light extraction layer formed on the emission layer and doped with a metal material for adjusting a refractive index thereof, thereby increasing a penetration rate of the photons; and
   a packaging layer formed on the light extraction layer for protecting the light emitting device and letting the photons to penetrate through.

2. The light emitting device with a light extraction layer of claim 1, wherein the metal material is selected from the group consisting of aluminum and is doped into the light extraction layer by co-evaporation.

3. The light emitting device with a light extraction layer of claim 1, wherein the thickness of the light extraction layer is adjusted according to harmonic oscillations of the photons and the light extraction layer covers the entire or side of the emission layer.

4. The light emitting device with a light extraction layer of claim 1, wherein the material of the light extraction layer is selected from the group consisting of tris(8-hydroxyquinolinato)aluminum (Alq3) and 4,4'-bis[N-(1-naphthyl)-N-phenyl-amino]biphenyl (NPB).

5. The light emitting device with a light extraction layer of claim 1, wherein the refractive index is between 1.5 and 2.5.

6. A fabricating method for a light emitting device with a light extraction layer, comprising the steps of:
   providing an emission layer for combining electrons and holes and generating a plurality of photons;
   forming a light extraction layer on the emission layer and doping the light extraction layer with a metal material for adjusting a refractive index thereof, thereby increasing a penetration rate of the photons; and
   forming a packaging layer on the light extraction layer for protecting the light emitting device and letting the photons to penetrate through.

7. The fabricating method of claim 6, wherein the metal material is selected from the group consisting of aluminum and is doped into the light extraction layer by co-evaporation.

8. The fabricating method of claim 6, wherein the thickness of the light extraction layer is adjusted according to harmonic oscillations of the photons and the light extraction layer covers the entire or side of the emission layer.

9. The fabricating method of claim 6, wherein the material of the light extraction layer is selected from the group consisting of tris(8-hydroxyquinolinato)aluminum (Alq3) and 4,4'-bis[N-(1-naphthyl)-N-phenyl-amino]biphenyl (NPB).

10. The fabricating method of claim 6, wherein the refractive index is between 1.5 and 2.5.

* * * * *